United States Patent [19]
Wells

[11] Patent Number: 5,172,052
[45] Date of Patent: Dec. 15, 1992

[54] CURRENT SENSOR ASSEMBLY AND METHOD

[75] Inventor: Paul Wells, Newberg, Oreg.

[73] Assignee: IIMorrow, Inc., Salem, Oreg.

[21] Appl. No.: 556,664

[22] Filed: Jul. 23, 1990

[51] Int. Cl.⁵ .................. G01R 1/20; G01R 19/10
[52] U.S. Cl. .................. 324/117 R; 324/117 H; 324/127; 336/176
[58] Field of Search .......... 324/117 R, 117 H, 127; 336/175, 176

[56] References Cited

U.S. PATENT DOCUMENTS

| | | | |
|---|---|---|---|
| 3,984,798 | 10/1976 | Bussen | 336/176 |
| 4,288,743 | 9/1981 | Schweitzer | 324/127 |
| 4,646,006 | 2/1987 | Schweitzer, Jr. | 324/127 |
| 4,717,872 | 1/1988 | Wagner et al. | 324/127 |
| 4,754,218 | 6/1988 | Wagner et al. | 324/127 |
| 4,794,329 | 12/1988 | Schweitzer, Jr. | 324/127 |
| 4,935,693 | 6/1990 | Falkowski et al. | 324/117 R |

*Primary Examiner*—Kenneth A. Wieder
*Assistant Examiner*—William J. Burns
*Attorney, Agent, or Firm*—William A. Birdwell & Associates

[57] ABSTRACT

An electric current sensor assembly and method. A housing containing a Hall effect device is provided with at least one curved, concave surface for placement against a wire carrying a current. The housing is attached to the wire by a strap that fastens around the housing and the wire and fits in grooves in the housing. When the assembly is installed, the Hall effect device is positioned so that the magnetic field produced by current in the wire passes through the Hall effect device and produces an electric signal proportional to the amplitude of the current in the wire. A set screw is movably mounted in the housing adjacent the Hall effect device to adjust the sensitivity of the current sensor assembly.

26 Claims, 2 Drawing Sheets

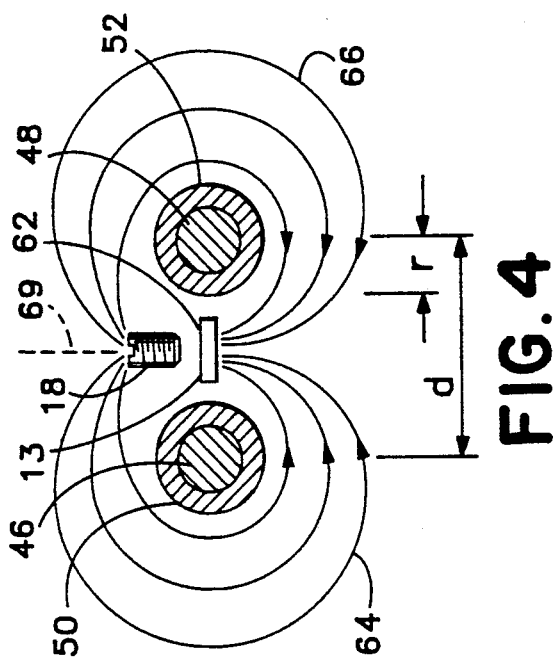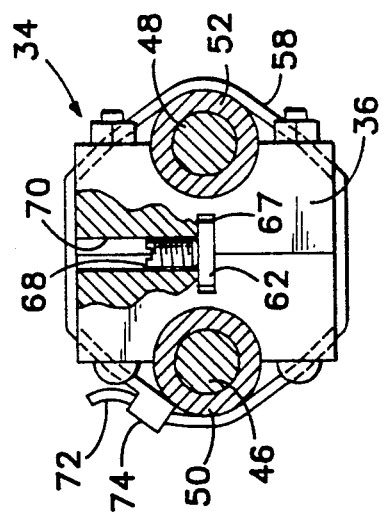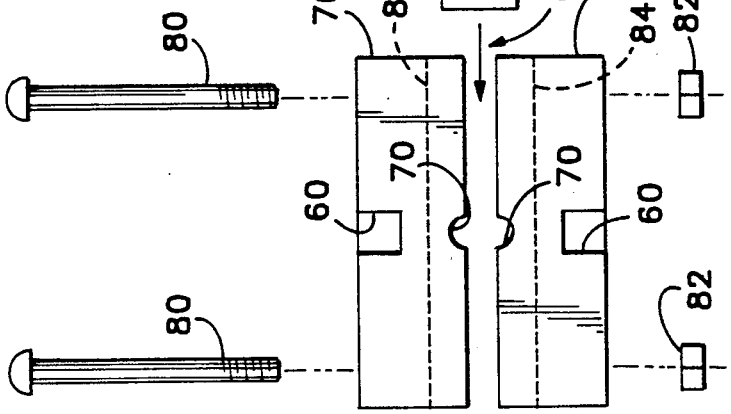

CURRENT SENSOR ASSEMBLY AND METHOD

BACKGROUND OF THE INVENTION

This invention relates to devices for sensing the current in wires, particularly to devices for attachment to a pair of wires without having to disconnect or break the wires for sensing the current in the wires.

It is often desirable to be able to measure the current flowing through a circuit without a direct electric connection to the circuit through which the current flows. One way of doing this is to employ a Hall effect device as a magnetic field strength-to-voltage transducer. Since the current in a wire produces a magnetic field around the wire, the magnitude of the current in the wire can be determined by measuring the strength of that magnetic field. As is commonly known in the art, the voltage output of a linear Hall effect device is proportional to the strength of the magnetic field passing through it. So, where a linear Hall effect device is placed adjacent a wire so that the magnetic field produced by current in the wire passes through the Hall effect device, the voltage output of the Hall effect device is proportional to the current in the wire.

In the prior art, Hall effect devices used for current measurement are sometimes mounted in an essentially monolithic assembly having an aperture through which a wire is fed. This requires that the assembly be installed prior to conecting the wire in its circuit, or that the wire be disconnected so that the assembly can be installed. Often that is inconvenient, as in the case of an existing circuit such as a starter current circuit for a vehicle, which requires heavy duty cable to carry a large amount of current and is therefore difficult to disconnect and reconnect. While there is at least one prior art assembly for holding a Hall effect device adjacent a wire which employs a metal loop that wraps around the wire and a Hall effect device sandwiched between the ends of the loop, installation of such a device on a heavy-duty cable requires bending and concomitant distortion of the loop which not only is awkward and difficult to accomplish, but may decrease the effectiveness of the device.

Prior art devices also often include current concentration elements. These are typically a piece of magnetic material mounted adjacent the transducer to increase the flux density of the magnetic field in the transducer, i.e., to "focus" the magnetic field in the transducer. Some prior art assemblies include a nearly complete magnetic circuit around the wire to guide the magnetic field into the transducer, such as a torroid of magnetic material with a transducer disposed in a gap in the torroid. Such prior art flux concentration elements are fixed in their relationship with the transducer so that the sensitivity of the assembly is fixed. The fixed sensitivity of such assemblies limits their range of applicability.

Thence, it can be seen that there is a need for a current sensor assembly that can be conveniently installed in an existing electric circuit without a direct electrical connection, and which provides sensitivity adjustment.

SUMMARY OF THE INVENTION

The present invention overcomes the aforementioned limitations of prior art current sensor assemblies and provides an assembly that can be conveniently installed in an existing circuit without disconnecting wires of the circuit. The assembly of the present invention comprises a housing that has at least one side with a curved, concave portion that fits against a wire. The housing is attached to the wire by a strap wrapped around the wire. When the assembly is so installed, a Hall effect device within the housing is disposed so that the magnetic field produced by current in the wire passes through the Hall effect device. The voltage output of the Hall effect device is therefore proportional to the strength of the magnetic field.

A set screw is movably installed in the housing adjacent the Hall effect device as a flux concentrator. When the set screw is rotated one direction it moves toward the Hall effect device to increase the flux density of the magnetic field in the transducer, and when the set screw is rotated the other direction it moves away from the Hall effect device to reduce the flux density therein. Consequently, the set screw may be used to adjust the sensitivity of the current sensor assembly.

Preferably, the housing is a block-like object generally in the shape of a rectangular prism having two opposing sides having curved, concave portions. The housing is ordinarily mounted between two wires of the same circuit carrying the same current in opposite directions. A groove is provided in the housing for receiving the strap that attaches the housing to the wires.

Therefore, it is a principal objective of the present invention to provide a new and improved electric current sensor assembly and method.

It is another objective of the present invention to provide a current sensor assembly that can be conveniently installed on an electric wire while the wire remains connected in an electric curcuit.

It is a further objective of the present invention to provide a current sensor assembly whose sensitivity can be adjusted.

It is yet another objective of the present invention to provide a current sensor assembly that is adapted for convent installation in a vehicle starter circuit for measurement of starter current.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 4 is a simplified end view of a current sensor according to the present invention showing lines of the magnetic fields of two wires carrying electric current.

FIG. 5 is an end, partial section view of the current sensor assembly FIG. 3.

FIG. 6 is a top, exploded view of the current sensor assembly of FIG. 3.

DESCRIPTION OF THE PREFERRED EMBODIMENT

Figure 1:
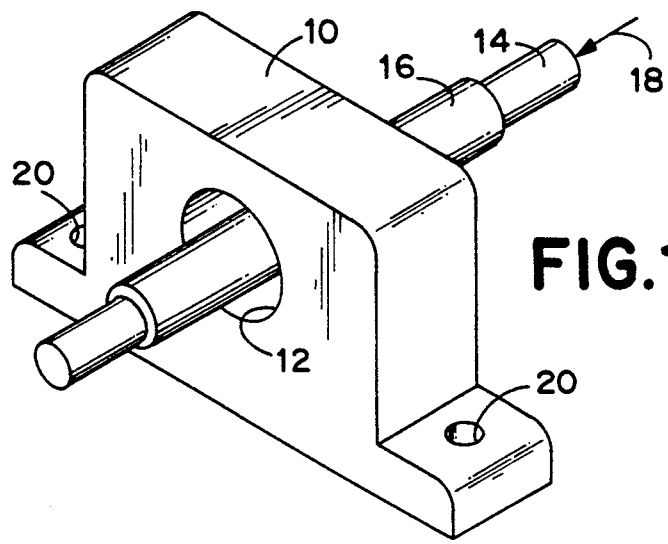
FIG. 1 shows a perspective view of a first type of prior art current sensor assembly installed on an electric wire.
Figure 2:
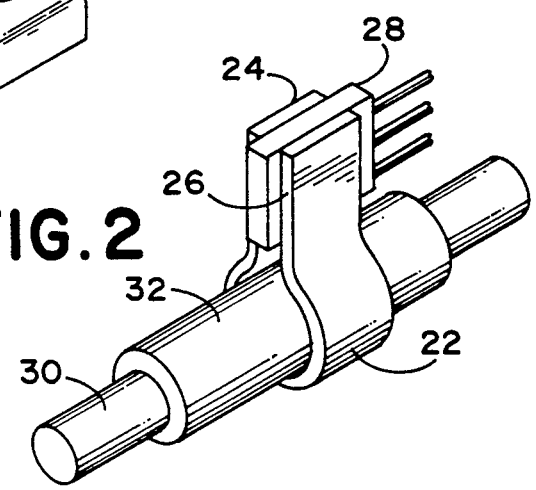
FIG. 2 shows a perspective view of a second type of prior art current sensor assembly installed on an electric wire.

Current sensor transducers, such as a Hall effect device, have typically been installed in assemblies such as those shown in FIG. 1 and FIG. 2. The prior art assembly 10 shown in FIG. 1 is, in effect, a monolithic device with a hole 12 through the center for receiving a wire 14 having insulation 16 and carrying a current as indicated by arrow 18. It would typically include a pair of mounting holes 20 as well. Since the assembly 10 is a monolithic device, the wire must be fed through the hole 12 before the wire is connected for carrying current. Typically, a transducer for sensing the strength of the magnetic field generated by the current 18 through the wire 14, e.g., the Hall effect device, is embedded in the assembly 10. Such an assembly may also include a piece of magnetic material disposed adjacent the transducer to concentrate or "focus" the magnetic flux from the current in the wire on the transducer. For example, a torroid with a gap may be used to guide the magnetic flux around a predetermined path and direct it through the transducer.

Another prior art device, shown in FIG. 2, comprises a loop of metal 22 having tab-like ends 24 and 26 with a transducer 28 sandwiched therebetween. The loop 22 is adapted to receive a wire 30 having insulation 32 thereon. The loop guides the magnetic flux from the current in the wire 30 and concentrates it on the transducer 28. In this case the wire may be connected at the time that the loop is placed around it, but the loop must be bent to accomplish that, which is an awkward and difficult procedure that may distort the loop.

Figure 3:
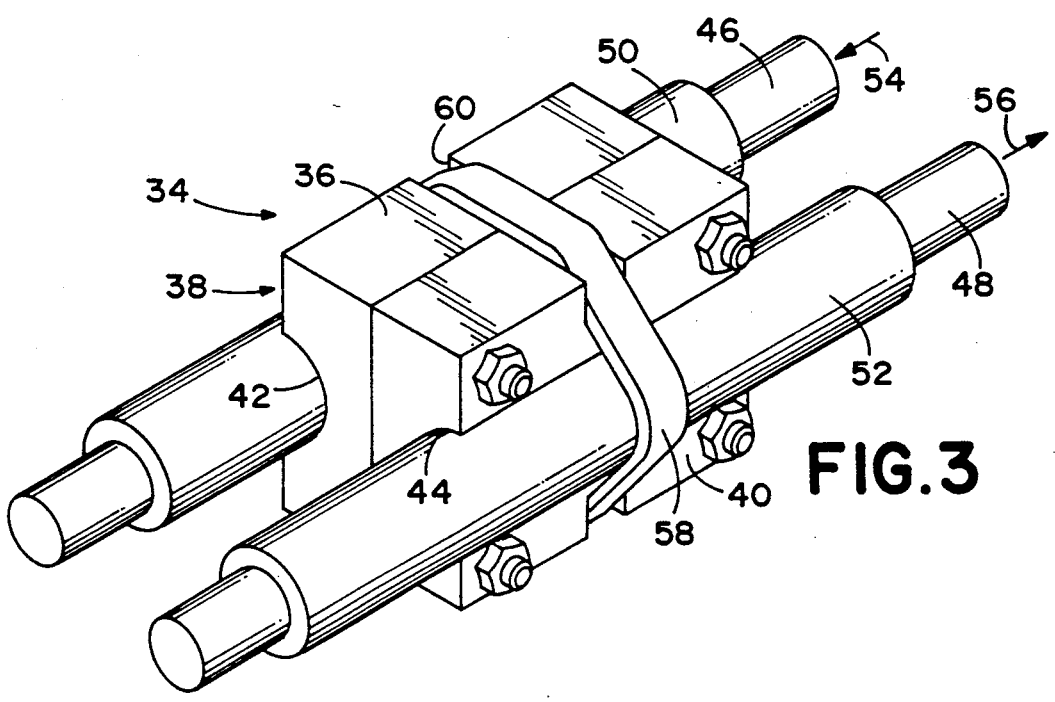
FIG. 3 shows a perspective view of a current sensor assembly according to the present invention installed on two electric wires.

A preferred embodiment 34 of a current sensor assembly according to the present invention is shown in FIG. 3. The assembly of the invention preferably comprises a block-like housing 36 generally in the shape of a rectangular prism, but for two curved, concave surface portions 42 and 44 on opposite sides 38 and 40 of the housing. The concave surface portions are preferably shaped to match the exterior surface of respective wires 46 and 48 having layers of insulation 50 and 52. Ordinarily, they would be semi-circular.

The wires would ordinarily be complementary, in that current would flow through wire 46 in the direction shown by arrow 54 to a current sink, and return through wire 48 in the direction shown by arrow 56. It is recognized, however, that there may be situations where the current flowing in wire 46 is not the same as the current flowing in wire 48. A strap 58 wraps around the two wires and the housing 36 to attach the wires to the housing, with the housing sandwiched in between. Preferably, a groove 60 is placed in the housing for receiving and positioning the strap 58. A transducer, preferably a Hall effect device, is mounted within the housing 36 between the two wires.

Turning to FIG. 4, the operation of the assembly 34 is shown diagramatically. A Hall effect device 62 is disposed between wires 46 and 48. Ordinarily such a device is manufactured in the shape of a relatively flat rectangular prism. The current detected by the device is a function of the magnetic flux density through the principal surface 63 of the device. Because of that, the device is mounted so that the principal surface 63 is parallel to the longitudinal dimensions of the wires 46 and 48.

Current in wire 46 causes magnetic flux to flow through the Hall effect device 62 as shown by field lines 64, and current in wire 48 causes magnetic flux to flow through the Hall effect device 62 as shown by field lines 66. The magnetic flux is concentrated, or focused, on the Hall effect device by a set screw 68. By moving the set screw forward or backward along its longitudinal axis 69, the flux density in the Hall effect device 62 may be increased or decreased, thereby providing an adjustment to the sensitivity of the current sensor assembly.

For two parallel wires 46 and 48 with current running in opposite directions so that their magnetic fields add where they pass through the Hall effect device 62, which is nominally at the midpoint between the two wires, the magnetic field flux density along a line intersecting the two wire centers is given by:

$$B = \frac{.32CI}{d}$$

where
B = magnetic field flux density,
I = current in the wires,
d = distance between the wires, and
C = a sensitivity adjustment factor dependent on the position of the set screw.

The voltage output of a linear Hall effect device, where connected to electronic curcuitry of a type commonly known in the art, is proportional to the flux density B of the magnetic field passing through the transducer. Thence, the voltage output is directly proportional to the current in the wires 46 and 48.

The relationship between all of the parts of the assembly 34 is best shown in FIG. 5. It can be seen that the Hall effect device 62 fits in a cavity 67 within the housing 36 and that the set screw 68, which has exterior threads, fits within a cylinder 70 which has interior threads so that the set screw may be moved forward and backward along its longitudinal axis by rotation. The strap 58 is of a conventional kind whereby one end 72 of the strap fits through a slot in the opposite end 74 of the strap and locks in place.

FIG. 6 shows how the assembly fits together. It can be seen that the housing 36 in fact comprises two parts 76 and 78 held together by four bolts 80 and complementary nuts 82. The edges of the cavity 67 which receives the Hall effect device 68 are shown by hidden lines 84. The wires 86 for the Hall effect device are fed out of one end of the housing 36 through the cavity 67 and typically terminate in a connector 88 for attachment to the conventional electronic circuitry (not shown) which drive the transducer.

To use the current sensor assembly, the Hall effect device 62 is placed within the cavity 67 as the parts 76 and 78 of the housing 36 are brought together, and those parts are fastened together by the bolts 80 and nuts 82. A set screw 68 is threaded into the cylinder 70 that is formed by the two housing parts 76 and 78. Two wires whose current is to be measured are placed along the sides of the assembly and the strap 58 is wrapped around the housing 36 in the groove 60 and fastened, thereby holding the wires in place against at the sides of the assembly. Set screw 68 is rotated until the electronic instrumentation, which for a Hall effect device is of a commonly known type, indicates appropriate sensitivity.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

I claim:

1. A method of sensing electric current in a pair of wires, comprising:
   (a) placing in a housing a transducer means for producing an electric signal representative of the strength of the magnetic fields from both of the wires, said magnetic fields passing through said transducer means additively, said housing having two sides with respective curved, concave surface portions for placement against respective wires, said two sides being disposed opposite one another on said object, said concave surface portions facing opposite one another;
   (b) placing said housing between said wires; and
   (c) attaching said housing to said wire.

2. The method of claim 1 wherein said transducer means comprises a Hall effect device.

3. The method of claim 1, wherein said attaching step comprises wrapping a strap around said housing and said wires and securing it in place.

4. An electric current sensor assembly, comprising:
   (a) transducer means for producing an electric signal representative of the strength of a magnetic field passing therethrough;
   (b) housing means for holding said transducer means adjacent a pair of wires so that the magnetic fields generated by current flowing through both of the wires pass through said transducer means additively;
   (c) flux concentrator means, made of magnetic material and disposed adjacent said transducer means so that the magnetic fields generated by current flowing through both of the wires pass through said flux concentrator means additively, for modifying the magnetic flux density in said transducer means of the magnetic fields of the current flowing through both wires by varying the reluctance of the flux path; and
   (d) adjustment means for varying the position of said flux concentrator means relative to said transducer means so as to vary simultaneously the sensitivity of said current sensor assembly to the current in both wires.

5. The assembly of claim 4, wherein said flux concentrator comprises a set screw disposed in a threaded aperture of said housing means so as to move closer to said transducer means when rotated in one direction and to move away from said transducer means when rotated in the opposite direction.

6. The assembly of claim 4, wherein said housing means comprises an object substantially in the shape of a rectangular prism, but for at least two sides having respective curved, concave surface portions for placement against respective wires, said two sides being disposed opposite one another on said object.

7. The assembly of claim 4, wherein said housing means includes means for holding said flux concentrator means adjacent said transducer means.

8. An electric current sensor assembly, comprising:
   (a) transducer means for producing an electric signal representative of the strength of a magnetic field passing therethrough;
   (b) housing means comprising an object substantially in the shape of a rectangular prism, including at least two sides having respective curved, concave surface portions for placement against respective wires, said two sides being disposed opposite one another on said object for holding said transducer means adjacent said wires so that the magnetic fields generated by current flowing through said wires pass through said transducer means, said transducer means being disposed within said housing between said two sides so that the respective magnetic fields from each said wire pass through said transducer means;
   (c) flux concentrator means disposed adjacent said transducer means for modifying the magnetic flux density in said transducer means of the magnetic fields of said current flowing through said wires; and
   (d) adjustment means for varying the position of said flux concentrator means relative to said transducer means so as to vary the sensitivity of said current sensor assembly.

9. The assembly of claim 8, wherein said housing means comprises two parts releasably held together by fasteners and being separable to insert and remove said transducer means and flux concentrator means, each said part including one of said two sides.

10. The assembly of claim 8, wherein said flux concentrator means is disposed within said housing means adjacent said transducer means so as to increase the magnetic flux density within said transducer means of the magnetic fields produced by current flowing through both said wires.

11. The assembly of claim 6, further comprising attachment means for attaching said housing means to said wire.

12. An electric current sensor assembly, comprising:
   (a) transducer means for producing an electric signal representative of the strength of a magnetic field passing therethrough;
   (b) housing means comprising an object substantially in the shape of a rectangular prism for holding said transducer means adjacent a wire so that the magnetic field generated by current flowing through the wire passes through said transducer means;
   (c) flux concentrator means disposed adjacent said transducer means for modifying the magnetic flux density in said transducer means of the magnetic field of said current flowing through said wire;
   (d) adjustment means for varying the position of said flux concentrator means relative to said transducer means so as to vary the sensitivity of said current sensor assembly; and
   (e) a strap adapted to be wrapped around said housing means and said wire and secured in place for attaching said housing means to said wire.

13. The assembly of claim 12 wherein said housing means includes at least one groove for receiving and holding said strap in place.

14. The assembly of claim 4, wherein said transducer means comprises a Hall effect device.

15. An electric current sensor assembly, comprising:
   (a) transducer means for producing an electric signal representative of the strength of a magnetic field passing therethrough;
   (b) housing means for holding said transducer means adjacent and substantially between a pair of wires so that the magnetic field generated by current flowing through both of the wires passes through said transducer means, said housing means comprising an object having two sides for placement adjacent respective wires, said two sides being disposed opposite one another on said object so that said housing means lies substantially between said wires; and (c) attachment means for attaching said housing means to said wires.

16. An electric current sensor assembly, comprising:
(a) transducer means for producing an electric signal representative of the strength of a magnetic field passing therethrough;
(b) housing means for holding said transducer means adjacent a wire so that the magnetic field generated by current flowing through the wire passes through said transducer means, said housing means comprising an object substantially in the shape of a rectangular prism, but for at least a portion of one side having a curved, concave surface for placement against said wire; and
(c) a strap adapted to be wrapped around said housing means and said wire and secured in place for attaching said housing means to said wire.

17. The assembly of claim 16 wherein said housing means includes at least one groove for receiving and holding said strap in place.

18. An electric current sensor assembly, comprising:
(a) transducer means for producing an electric signal representative of the strength of a magnetic field passing therethrough;
(b) housing means for holding said transducer means adjacent a wire so that the magnetic field generated by current flowing through the wire passes through said transducer means, said housing means comprising an object substantially in the shape of a rectangular prism, but for at least two sides having respective curved, concave surface portions for placement against respective wires, said two sides being disposed opposite one another on said object, said transducer means being disposed within said housing means between said two sides so that the respective magnetic fields from each said wire pass through said transducer means; and
(c) attachment means for attaching said housing means to said wire.

19. The assembly of claim 18, wherein said housing means comprises two parts releasably held together by fasteners and being separable to insert and remove said transducer means and flux concentrator means, each said part including one of said two sides.

20. The assembly of claim 15, wherein said transducer means comprises a Hall effect device.

21. A method of sensing electric current in a pair of wires, comprising:
(a) placing next to said wires a transducer means for producing an electric signal representative of the strength of a magnetic field passing therethrough, said transducer means being positioned so as to receive magnetic flux from both said wires additively;
(b) placing proximate said transducer means a magnetic material that modifies the flux density within said transducer means of the magnetic fields of the current flowing through both of the wires by varying the reluctance of the flux path, the magnetic fields of the current through both of the wires passing through said material additively; and
(c) adjusting the position of said material relative to said transducer means so as to adjust simultaneously the sensitivity of said electric signal to the magnetic fields of both of said wires.

22. The method of claim 21, wherein said transducer means is a Hall effect device.

23. The assembly of claim 15, wherein said two sides of said housing each have respective curved, concave surface portions for placement against respective wires.

24. The assembly of claim 15, wherein said transducer means is disposed within said housing means between said two sides so that the respective magnetic fields from each of the wires pass through said transducer means additively.

25. The assembly of claim 15, wherein said attachment means comprises a strap adapted to be wrapped around said housing means and said wires and secured in place.

26. The assembly of claim 25 wherein said housing means includes at least one groove for receiving and holding said strap in place.

* * * * *